US011341906B2

(12) United States Patent
Yang et al.

(10) Patent No.: US 11,341,906 B2
(45) Date of Patent: May 24, 2022

(54) PIXEL CIRCUIT, METHOD, AND AMOLED DISPLAY WITH OPTICAL TOUCH SENSING

(71) Applicant: BOE TECHNOLOGY GROUP CO., LTD., Beijing (CN)

(72) Inventors: Shengji Yang, Beijing (CN); Xue Dong, Beijing (CN); Xiaochuan Chen, Beijing (CN); Minghua Xuan, Beijing (CN); Jing Yu, Beijing (CN); Yingzi Wang, Beijing (CN); Weifeng Han, Beijing (CN); Huijuan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 557 days.

(21) Appl. No.: 16/330,449

(22) PCT Filed: Jun. 22, 2018

(86) PCT No.: PCT/CN2018/092402
§ 371 (c)(1),
(2) Date: Mar. 5, 2019

(87) PCT Pub. No.: WO2019/029282
PCT Pub. Date: Feb. 14, 2019

(65) Prior Publication Data
US 2021/0325987 A1 Oct. 21, 2021

(30) Foreign Application Priority Data

Aug. 8, 2017 (CN) .......................... 201710669444.8

(51) Int. Cl.
*G09G 3/32* (2016.01)
*G09G 3/3208* (2016.01)
(Continued)

(52) U.S. Cl.
CPC ........... *G09G 3/3208* (2013.01); *G06F 3/042* (2013.01); *G06F 3/0412* (2013.01);
(Continued)

(58) Field of Classification Search
CPC ...... G06F 3/0412; G06F 3/0416; G06F 3/042; G09G 3/3233; G09G 2300/0426; G09G 2300/0809; G09G 2360/14; H01L 27/323
See application file for complete search history.

(56) References Cited

U.S. PATENT DOCUMENTS

2006/0214893 A1 9/2006 Tseng et al.
2016/0274719 A1* 9/2016 Yang ........................ G06F 3/042

FOREIGN PATENT DOCUMENTS

CN 102338946 A 2/2012
CN 103996377 A 8/2014
(Continued)

OTHER PUBLICATIONS

PCT International Search Report, Application No. PCT/CN2018/092402, dated Sep. 13, 2018, 8 pages: with English translation.
(Continued)

*Primary Examiner* — Liliana Cerullo
(74) *Attorney, Agent, or Firm* — Armstrong Teasdale LLP (57) ABSTRACT

The present disclosure provides a pixel circuit and a drive method thereof, and a touch display apparatus. The pixel circuit includes a pixel driving circuit, an optical sensing circuit, and a light-emitting element. The pixel driving circuit is configured to drive the light-emitting element to emit light, based on a first control signal from a first control line, a second control signal from a second control line, a scanning signal from a scanning line, and a data signal from a data line. The optical sensing circuit is configured to sense an optical signal, convert the sensed optical signal into an electric signal, and output the electric signal via a reading (Continued)

line based on the first control signal, the second control signal, the scanning signal, and the data signal.

7 Claims, 7 Drawing Sheets

(51) Int. Cl.
 *G06F 3/041* (2006.01)
 *G06F 3/042* (2006.01)
 *G09G 3/3233* (2016.01)
 *H01L 27/32* (2006.01)
(52) U.S. Cl.
 CPC ......... *G06F 3/0416* (2013.01); *G09G 3/3233* (2013.01); *H01L 27/323* (2013.01); *G09G 2300/0426* (2013.01); *G09G 2300/0809* (2013.01); *G09G 2360/14* (2013.01)

(56) References Cited

FOREIGN PATENT DOCUMENTS

| | | |
|---|---|---|
| CN | 104102382 A | 10/2014 |
| CN | 104112427 A | 10/2014 |
| CN | 104217677 A | 12/2014 |
| CN | 104252844 A | 12/2014 |
| CN | 107274831 A | 10/2017 |
| WO | WO-2016015392 A1 * | 2/2016 ........... G06F 3/0412 |

OTHER PUBLICATIONS

PCT Written Opinion, Application No. PCT/CN2018/092402, dated Sep. 13, 2018, 8 pages.: with English translation of relevant part.

* cited by examiner

PIXEL CIRCUIT, METHOD, AND AMOLED DISPLAY WITH OPTICAL TOUCH SENSING

CROSS REFERENCE TO RELATED APPLICATIONS

This patent application is a National Stage Entry of PCT/CN2018/092402 filed on Jun. 22, 2018, which claims the benefit and priority of Chinese Patent Application No. 201710669444.8 filed on Aug. 8, 2017, the disclosures of which are incorporated by reference herein in their entirety as part of the present application.

BACKGROUND

The present disclosure relates to the field of display technologies, and more particularly, to a pixel circuit, a drive method for driving the pixel circuit, and a touch display apparatus.

Active-matrix organic light-emitting diode (AMOLED) displays have been widely used in display fields such as mobile phones, PDA, and digital cameras because they are low in energy consumption, low in manufacturing cost, good in self-luminous, wide in viewing angle, and fast in response speed.

BRIEF DESCRIPTION

Embodiments of the present disclosure provide a pixel circuit and a drive method thereof, and a touch display apparatus.

A first aspect of the present disclosure provides a pixel circuit. The pixel circuit includes a pixel driving circuit, an optical sensing circuit, and a light-emitting element. The pixel driving circuit is configured to drive the light-emitting element to emit light, based on a first control signal from a first control line, a second control signal from a second control line, a scanning signal from a scanning line, and a data signal from a data line. The optical sensing circuit is configured to sense an optical signal, convert the sensed optical signal into an electric signal, and output the electric signal via a reading line based on the first control signal, the second control signal, the scanning signal, and the data signal.

In some embodiments of the present disclosure, the optical sensing circuit includes a photoelectric sensor and a signal control circuit. The photoelectric sensor is configured to sense the optical signal and convert the sensed optical signal into the electric signal. The signal control circuit is coupled to the photoelectric sensor and is configured to output the electric signal from the photoelectric sensor via the reading line, based on the first control signal, the second control signal, the scanning signal, and the data signal.

In some embodiments of the present disclosure, the signal control circuit includes a first capacitor, a sensing reset unit, a sensing writing unit, and a sensing control unit. The first capacitor is coupled to the photoelectric sensor, the sensing reset unit, the sensing writing unit, and the sensing control unit. The sensing reset unit is coupled to the first control line and a reset signal provision terminal providing a reset signal, and is configured to reset the first capacitor and the photoelectric sensor based on the first control signal and the reset signal. The sensing writing unit is coupled to the scanning line and the data line, and is configured to enable, based on the scanning signal, the data signal to charge the first capacitor via the photoelectric sensor. A charging current of the first capacitor is related to the optical signal sensed by the photoelectric sensor. The sensing control unit is coupled to the second control line and the reading line, and is configured to discharge, based on the second control signal, the first capacitor so as to output the electric signal from the reading line.

In some embodiments of the present disclosure, the photoelectric sensor includes a photosensing transistor. A control electrode of the photosensing transistor is coupled to a first terminal of the first capacitor and a first electrode of the photosensing transistor, and a second electrode of the photosensing transistor is coupled to a second terminal of the first capacitor.

In some embodiments of the present disclosure, the sensing reset unit includes a first transistor. A control electrode of the first transistor is coupled to the first control line, a first electrode of the first transistor is coupled to the reset signal provision terminal, and a second electrode of the first transistor is coupled to the first electrode and the control electrode of the photosensing transistor.

In some embodiments of the present disclosure, the sensing writing unit includes a second transistor. A control electrode of the second transistor is coupled to the scanning line, a first electrode of the second transistor is coupled to the data line, and a second electrode of the second transistor is coupled to the first electrode and the control electrode of the photosensing transistor.

In some embodiments of the present disclosure, the sensing control unit includes a third transistor. A control electrode of the third transistor is coupled to the second control line, a first electrode of the third transistor is coupled to the second terminal of the first capacitor, and a second electrode of the third transistor is coupled to the reading line.

In some embodiments of the present disclosure, the pixel driving circuit includes a first drive transistor, a second drive transistor, a second capacitor, a display reset unit, a display writing unit, and a display control unit. A control electrode and a second electrode of the first drive transistor are coupled to a control electrode of the second drive transistor via a first node, and a first electrode of the first drive transistor is coupled to the display writing unit. A first electrode of the second drive transistor is coupled to a first voltage terminal providing a first voltage, and a second electrode of the second drive transistor is coupled to the display control unit. A first terminal of the second capacitor is coupled to the first node, and a second terminal of the second capacitor is coupled to the first voltage terminal. The display reset unit is coupled to the first control line, a second voltage terminal providing a second voltage and the first node, and is configured to reset the second capacitor based on the first control signal and the second voltage. The display writing unit is coupled to the scanning line and the data line, and is configured to enable, based on the scanning signal, the data signal to charge the second capacitor via the display writing unit and the first drive transistor until the first drive transistor is disabled. The display control unit is coupled to the second control line and the light-emitting element, and is configured to drive, based on the second control signal and the second capacitor, the second drive transistor to generate a drive current so as to drive the light-emitting element to emit light.

In some embodiments of the present disclosure, the display reset unit includes a fourth transistor. A control electrode of the fourth transistor is coupled to the first control line, a first electrode of the fourth transistor is coupled to the second voltage terminal, and a second electrode of the fourth transistor is coupled to the first node.

In some embodiments of the present disclosure, the display writing unit includes a fifth transistor. A control electrode of the fifth transistor is coupled to the scanning line, a first electrode of the fifth transistor is coupled to the data line, and a second electrode of the fifth transistor is coupled to the first electrode of the first drive transistor.

In some embodiments of the present disclosure, the display control unit includes a sixth transistor. A control electrode of the sixth transistor is coupled to the second control line, a first electrode of the sixth transistor is coupled to the second electrode of the second drive transistor, and a second electrode of the sixth transistor is coupled to the light-emitting element.

A second aspect of the present disclosure provides a touch display apparatus. The touch display apparatus includes a plurality of pixel circuits according to the first aspect of the present disclosure and a processing unit. The processing unit is coupled to reading lines of the plurality of pixel circuits, and is configured to determine whether a touch operation occurs based on electric signals from the plurality of reading lines.

In some embodiments of the present disclosure, the processing unit is configured to calculate a variation of the optical signal based on the electric signals, and to determine whether the touch operation occurs based on the variation of the optical signal and a preset threshold.

In some embodiments of the present disclosure, the processing unit is further configured to determine, when the touch operation occurs, a touch location based on the reading line of the corresponding pixel circuit and a second control line.

In some embodiments of the present disclosure, the plurality of pixel circuits are arranged as sub-pixels spaced apart from one another.

A third aspect of the present disclosure provides a drive method for driving the pixel circuit according to the first aspect of the present disclosure. In this drive method, the optical sensing circuit and the pixel driving circuit are reset based on the first control signal. Next, the optical signal sensed by the optical sensing circuit is converted into the electric signal based on the first control signal, the scanning signal and the data signal, and a voltage for driving the light-emitting element to emit light is stored in the pixel driving circuit. Next, the electric signal is outputted from the optical sensing circuit based on the second control signal, and the light-emitting element is driven to emit light by an electric current corresponding to the stored voltage, in the pixel driving circuit.

In some embodiments of the present disclosure, the optical sensing circuit includes a photoelectric sensor and a signal control circuit. The signal control circuit includes a first capacitor, a sensing reset unit, a sensing writing unit, and a sensing control unit. The first capacitor is coupled to the photoelectric sensor, the sensing reset unit, the sensing writing unit, and the sensing control unit. The sensing reset unit is coupled to the first control line and the reset signal provision terminal. The sensing writing unit is coupled to a scanning line and a data write line. The sensing control unit is coupled to a second control line and a read line. In the drive method, the reset signal is provided, based on the first control signal, to the sensing reset unit and the photoelectric sensor to reset the first capacitor and the photoelectric sensor. Next, the data signal is provided, based on the first control signal and the scanning signal, to the sensing writing unit and the photoelectric sensor, so as to provide the data signal to the first capacitor. Next, the first capacitor is discharged based on the second control signal via the sensing control unit to output the electric signal through the reading line.

In further embodiments of the present disclosure, the pixel driving circuit includes a first drive transistor, a second drive transistor, a second capacitor, a display reset unit, a display writing unit, and a display control unit. A control electrode and a second electrode of the first drive transistor are coupled to a control electrode of the second drive transistor via a first node, and a first electrode of the first drive transistor is coupled to the display writing unit. A first electrode of the second drive transistor is coupled to a first voltage terminal providing a first supply voltage, and a second electrode of the second drive transistor is coupled to the display control unit. A first terminal of the second capacitor is coupled to the first node, and a second terminal of the second capacitor is coupled to the first voltage terminal. The display reset unit is coupled to the first control line and the second voltage terminal. The display writing unit is coupled to the scanning line and the data line. The display control unit is coupled to the second control line and the light-emitting element. Further in this drive method, a second voltage is provided, based on the first control signal, to the display reset unit to reset the second capacitor. Next, the data signal is provided, based on the scanning signal, to the display writing unit and the first drive transistor, such that the second capacitor is charged until the first drive transistor is disabled. Next, the second drive transistor is driven to generate a drive current based on the second control signal and the second capacitor, and the drive current is provided to the light-emitting element via the display control unit.

DETAILED DESCRIPTION

The embodiments of the present disclosure are described in detail as below. Examples of the embodiments are as shown in the drawings, in which same or similar reference numbers represent same or similar elements or elements with same or similar functions. The embodiments described with reference to the drawings are exemplary, which is just intended to explain the present disclosure, and should not be interpreted as limiting the present disclosure.

To make the technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protecting scope of the present disclosure.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all embodiments of the present disclosure, a source and a drain (an emitter and a collector) of a transistor are symmetrical, and a conduction current between a source and a drain (an emitter and a collector) of an N-type transistor is opposite in direction to that between a source and a drain (an emitter and a collector) of a P-type transistor. Therefore, in embodiments of the present disclosure, a controlled intermediate terminal of the transistor is referred to as a control electrode, a signal input terminal is referred to as a first electrode, and a signal output terminal is referred to as a second electrode. The transistors used in embodiments of the present disclosure mainly are switching transistors. In addition, terms such as "first" and "second" are only used to distinguish one element (or a part of the element) from another element (or another part of this element).

The design of a pixel circuit is critical to an AMOLED organic light-emitting display, and an organic light-emitting diode (OLED) in the AMOLED is current-driven and needs a stable current to control light emission. However, in a pixel driving circuit that drives the OLED to emit light, the threshold voltages of the drive transistors in the pixels are nonuniform due to manufacturing process and device aging, etc. This causes electric current flowing through the OLED in each pixel to be varying, thereby having a negative effect on a display performance of the entire screen.

In addition, with reference to the current development trend of touch technologies, compared with capacitive touch, a photosensing touch has equivalent touch sensitivity and is not limited by the size of the module itself. A pixel circuit having an optical sensing function and a touch display apparatus having the pixel circuit provided by the embodiments of the present disclosure are described below with reference to the drawings.

Figure 1:
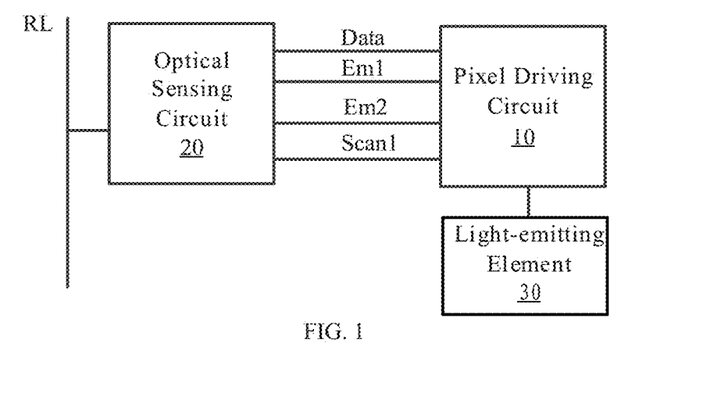
FIG. 1 is a schematic block diagram of a pixel circuit according to an embodiment of the present disclosure.

FIG. 1 is a schematic block diagram of a pixel circuit 100 according to an embodiment of the present disclosure. As shown in FIG. 1, the pixel circuit 100 may include a pixel driving circuit 10, an optical sensing circuit 20, and a light-emitting element 30 (such as an OLED). The pixel driving circuit 10 is coupled to a first control line Em1, a second control line Em2, a scanning line Scan1, a data line Data, the optical sensing circuit 20 and the light-emitting element 30, and is configured to drive the light-emitting element 30 to emit light, based on a first control signal from the first control line Em1, a second control signal from the second control line Em2, a scanning signal from the scanning line Scan1, and a data signal from the data line Data. The optical sensing circuit 20 is coupled to the first control line Em1, the second control line Em2, the scanning line Scan1, the data line Data, a reading line RL, and the pixel driving circuit 10, and is configured to sense an optical signal, convert the sensed optical signal into an electric signal, and output the electric signal via the reading line RL based on the first control signal, the second control signal, the scanning signal, and the data signal.

The pixel circuit 100 according to the embodiments of the present disclosure can realize integration of optical sensing and pixel driving. In addition, the pixel driving circuit 10 and the optical sensing circuit 20 shares the first control line Em1, the second control line Em2, the scanning line Scan1, and the data line Data, which realizes efficient integration of optical sensing and pixel driving, and saves layout space of the pixel circuit.

Figure 2:
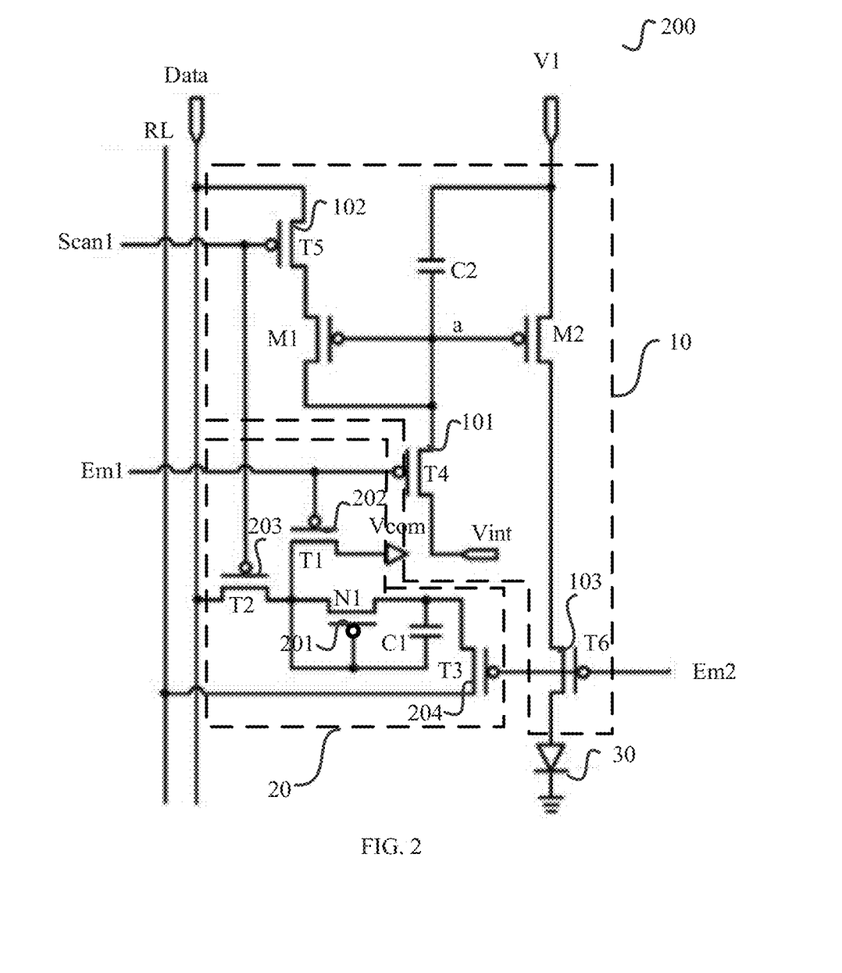
FIG. 2 is an exemplary circuit diagram of a pixel circuit according to an embodiment of the present disclosure.

FIG. 2 illustrates an exemplary circuit diagram of a pixel circuit 200 according to an embodiment of the present disclosure.

As shown in FIG. 2, the optical sensing circuit 20 may include a photoelectric sensor 201 and a signal control circuit (a part of the optical sensing circuit 20 excluding the photoelectric sensor 201). The photoelectric sensor 201 is configured to sense the optical signal and convert the sensed optical signal into the electric signal.

The signal control circuit is coupled to the photoelectric sensor 201 and is configured to output the electric signal from the photoelectric sensor 201 via the reading line RL, based on the first control signal, the second control signal, the scanning signal, and the data signal.

As shown in FIG. 2, the signal control circuit may include a first capacitor C1, a sensing reset unit 202, a sensing writing unit 203, and a sensing control unit 204. The first capacitor C1 is coupled to the photoelectric sensor 201, the sensing reset unit 202, the sensing writing unit 203, and the sensing control unit 204. The sensing reset unit 202 is coupled to the first control line Em1 and a reset signal provision terminal Vcom providing a reset signal, and is configured to reset the first capacitor C1 and the photoelectric sensor 201 based on the first control signal provided by the first control line Em1 and the reset signal provided by the reset signal provision terminal Vcom. The sensing writing unit 203 is coupled to the scanning line Scan1 and the data line Data, and is configured to enable, based on the scanning signal provided by the scanning line Scan1, the data signal provided by the data line Data to charge the first capacitor C1 via the photoelectric sensor 201. Here, a charging current of the first capacitor C1 is related to the optical signal sensed by the photoelectric sensor 201. The sensing control unit 204 is coupled to the second control line Em2 and the reading line RL, and is configured to discharge, based on the second control signal provided by the second control line Em2, the first capacitor C1 so as to output the electric signal from the reading line RL.

As shown in FIG. 2, according to some embodiments of the present disclosure, the photoelectric sensor 201 may include a photosensing transistor N1. A control electrode of the photosensing transistor N1 is coupled to a first terminal of the first capacitor C1 and a first electrode of the photosensing transistor N1, and a second electrode of the photosensing transistor N1 is coupled to a second terminal of the first capacitor C1. The sensing reset unit 202 may include a first transistor T1. A control electrode of the first transistor T1 is coupled to the first control line Em1, a first electrode of the first transistor T1 is coupled to the reset signal provision terminal Vcom providing a reset signal, and a second electrode of the first transistor T1 is coupled to the first electrode and the control electrode of the photosensing transistor N1. The sensing writing unit 203 may include a second transistor T2. A control electrode of the second transistor T2 is coupled to the scanning line Scan1, a first electrode of the second transistor T2 is coupled to the data line Data, and a second electrode of the second transistor T2 is coupled to the first electrode and the control electrode of the photosensing transistor N1. The sensing control unit 204 may include a third transistor T3. A control electrode of the third transistor T3 is coupled to the second control line Em2, a first electrode of the third transistor T3 is coupled to the second terminal of the first capacitor C1, and a second electrode of the third transistor T3 is coupled to the reading line RL.

In the example as shown in FIG. 2, the optical touch module 20 may include the photosensing transistor N1, the first transistor T1, the second transistor T2, the third transistor T3, and the first capacitor C1. The photosensing transistor N1 is a photosensing thin film transistor (TFT). The first transistor T1, the second transistor T2, and the third transistor T3 are TFTs. The photosensing transistor N1 may generate a photocurrent (i.e., an electric signal) when light irradiates on the photosensing transistor N1, and the photosensing transistor N1 may generate photocurrents having different intensities when it senses different illumination intensities. The first transistor T1, the second transistor T2, and the third transistor T3 act as switches controlling the photosensing TFTs. The first capacitor C1 is configured to store the photocurrent generated by the photosensing TFT. Moreover, the third transistor T3 also plays a role in controlling the read of the electric signal. When the third transistor T3 is enabled, the photocurrent stored in the first capacitor C1 is outputted via the reading line RL.

The pixel driving circuit 10 may include a first drive transistor M1, a second drive transistor M2, a second capacitor C2, a display reset unit 101, a display writing unit 102, and a display control unit 103.

A control electrode and a second electrode of the first drive transistor M1 are coupled to a control electrode of the second drive transistor M2 via a first node a, and a first electrode of the first drive transistor M1 is coupled to the display writing unit 102. A first electrode of the second drive transistor M2 is coupled to a first voltage terminal V1 providing a first voltage, and a second electrode of the second drive transistor M2 is coupled to the display control unit 103. A first terminal of the second capacitor C2 is coupled to the first node a, and a second terminal of the second capacitor C2 is coupled to the first voltage terminal V1 providing the first voltage. The display reset unit 101 is coupled to the first control line Em1, a second voltage terminal Vint providing a second voltage and the first node a, and is configured to reset the second capacitor C2 based on the first control signal provided by the first control line Em1 and the second voltage. The display writing unit 102 is coupled to the scanning line Scan1 and the data line Data, and is configured to enable, based on the scanning signal provided by the scanning line Scan1, the data signal provided by the data line Data to charge the second capacitor C2 via the display writing unit 102, and the first drive transistor M1 until the first drive transistor M1 is disabled. The display control unit 103 is coupled to the second control line Em2 and the light-emitting element 30, and is configured to drive, based on the second control signal provided by the second control line Em2 and the second capacitor C2, the second drive transistor M2 to generate a drive current so as to drive the light-emitting element 30 (such as an OLED) to emit light.

In some embodiments of the present disclosure, the display reset unit 101 may include a fourth transistor T4. A control electrode of the fourth transistor T4 is coupled to the first control line Em1, a first electrode of the fourth transistor T4 is coupled to the second voltage terminal Vint providing the second voltage, and a second electrode of the fourth transistor T4 is coupled to the first node a. The display writing unit 102 may include a fifth transistor T5. A control electrode of the fifth transistor T5 is coupled to the scanning line Scan1, a first electrode of the fifth transistor T5 is coupled to the data line Data, and a second electrode of the fifth transistor T5 is coupled to the first electrode of the first drive transistor M1. The display control unit 103 may include a sixth transistor T6. A control electrode of the sixth transistor T6 is coupled to the second control line Em2, a first electrode of the sixth transistor T6 is coupled to the second electrode of the second drive transistor M2, and a second electrode of the sixth transistor T6 is coupled to the light-emitting element 30 (such as an OLED).

In the example as shown in FIG. 2, the pixel driving circuit 10 may include a first drive transistor M1, a second drive transistor M2, a second capacitor C2, a fourth transistor T4, a fifth transistor T5, and a sixth transistor T6. Both the first drive transistor M1 and the second drive transistor M2 are drive TFTs. The fourth transistor T4, the fifth transistor T5, and the sixth transistor T6 are switch TFTs. The pixel driving circuit 10 drives, by controlling the fourth transistor T4, the fifth transistor T5, and the sixth transistor T6, the second drive transistor M2 to generate a drive current so as to drive the light-emitting element 30 to emit light.

According to some embodiments of the present disclosure, the photosensing transistor N1, the first transistor T1, the second transistor T2, the third transistor T3, the first drive transistor M1, the second drive transistor M2, the fourth transistor T4, the fifth transistor T5, and the sixth transistor T6 may be P-type TFTs. Adopting a layout of the pixel circuit in which all the transistors in the pixel driving circuit 10 and the optical sensing circuit 20 are the P-type TFTs is advantageous for manufacturing process.

In some embodiments of the present disclosure, the pixel driving circuit 10 may output the electric signal to the OLED 30 based on the first control signal, the second control signal, the scanning signal, and the data signal. The OLED 30 generates emitted light upon combination of an electron and a hole (a positively charged ion). In this way, the OLED 30 may directly convert the electric signal into an optical signal. The pixel driving circuit 10 controls the OLED 30 to emit light based on a stable current.

According to some embodiments of the present disclosure, the pixel circuit 100 may adopt a low temperature poly-silicon (LTPS) manufacturing process, such that the design of a plurality of thin film transistors and capacitors does not affect the aperture ratio of the module.

Figure 3:
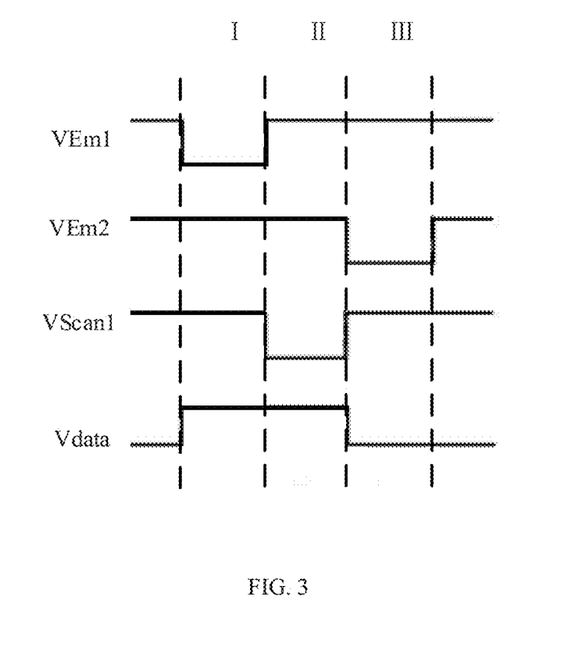
FIG. 3 is a timing diagram of each signal of the pixel circuit as shown in FIG. 2.

FIG. 3 illustrates a timing diagram of each signal of the pixel circuit 200 as shown in FIG. 2. In the following description, it is assumed that all the transistors are P-type transistors. The first voltage is at a high level, whereas the second voltage is at a low level.

Figure 4:
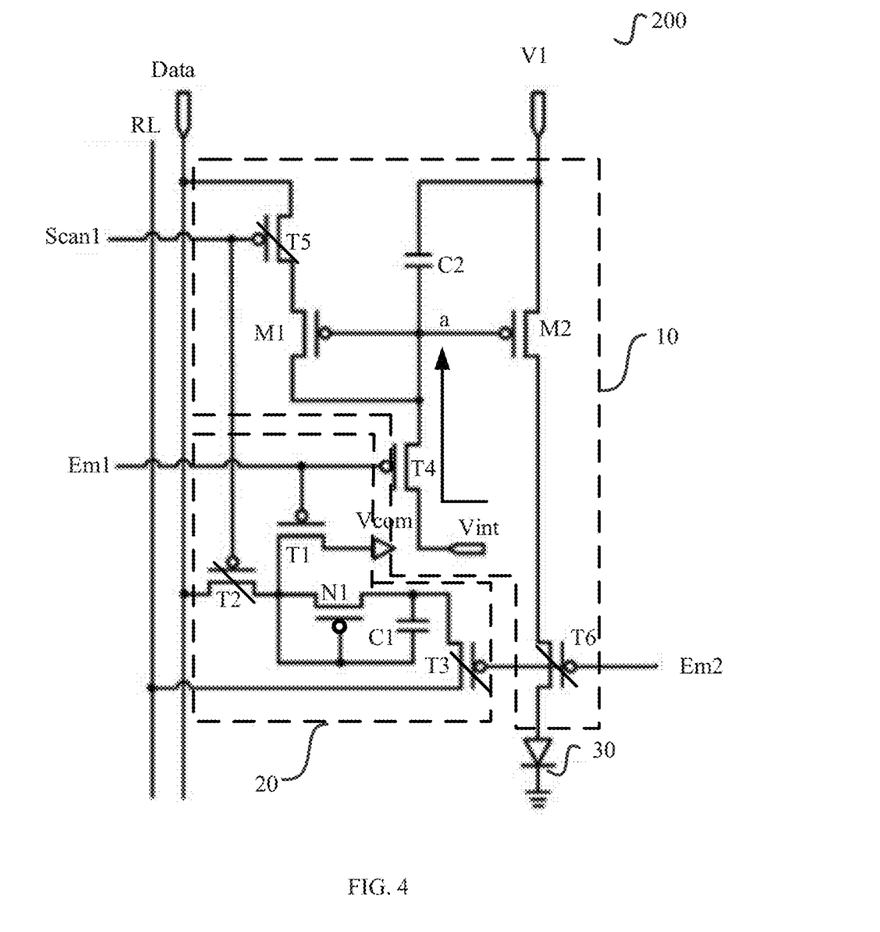
FIG. 4 is an exemplary equivalent circuit diagram of the pixel circuit according to an embodiment of the present disclosure in a first phase.

As shown in FIG. 3, in the first phase I, the first control signal VEm1 is at the low level. The second control signal VEm2, the data signal Vdata, and the scanning signal VScan1 are at the high level. FIG. 4 illustrates an exemplary equivalent circuit diagram of the pixel circuit 200 according to an embodiment of the present disclosure in the first phase, wherein an oblique line on a transistor represents that this transistor is disabled.

The first transistor T1 is enabled because the first control signal VEm1 is at the low level. The second transistor T2 is disabled because the scanning signal VScan1 is at the high level. The third transistor T3 is disabled because the second control signal VEm2 is at the high level. Therefore, a reset signal from the reset signal provision terminal Vcom resets the photosensing transistor N1 via the first transistor T1. The photosensing transistor N1 is enabled, such that the first capacitor C1 is reset. The reset signal provision terminal Vcom may be a ground terminal. Therefore, the photosensing transistor N1 and the first capacitor C1 may be grounded via the first transistor T1. At this phase, the control terminal of the photosensing transistor N1 is grounded, and thus the photosensing transistor N1 is enabled.

The fourth transistor T4 is enabled because the first control signal VEm1 is at the low level. Therefore, the second voltage of the second voltage terminal Vint resets the second capacitor C2 via the fourth transistor T4 (as indicated by the arrow in FIG. 4), such that the voltage of the first terminal (i.e., the voltage of the first node a) of the second capacitor C2 is reset as the second voltage. Both the first drive transistor M1 and the second drive transistor M2 are enabled when the second voltage terminal Vint supplies low level voltage. The fifth transistor T5 is disabled because the scanning signal VScan1 is at the high level. The sixth transistor T6 is disabled because the second control signal VEm2 is at the high level.

Figure 5:
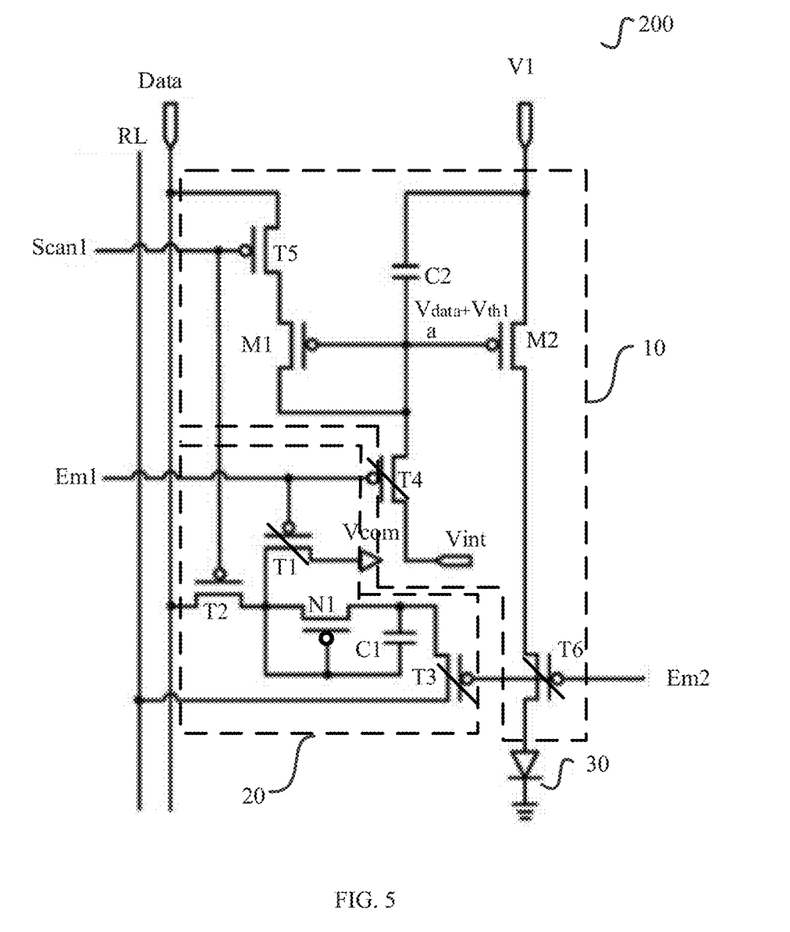
FIG. 5 is an exemplary equivalent circuit diagram of the pixel circuit according to an embodiment of the present disclosure in a second phase.

In the second phase II, the scanning signal VScan1 is at the low level. The first control signal VEm1, the second control signal VEm2 and the data signal Vdata are at the high level. FIG. 5 illustrates an exemplary equivalent circuit diagram of the pixel circuit 200 according to an embodiment of the present disclosure in the second phase, wherein the oblique line on a transistor represents that this transistor is disabled.

The first transistor T1 is disabled because the first control signal VEm1 is at the high level. Therefore, the reset signal from the reset signal provision terminal does not have negative effect on the photosensing transistor N1 and the first capacitor C1. The second transistor T2 is enabled because the scanning signal VScan1 is at the low level. The third transistor T3 is disabled because the second control signal VEm2 is at the high level. By means of the holding function of the first capacitor C1, the control electrode of the photosensing transistor N1 is maintained at the low level, and thus the photosensing transistor N1 is continued to be enabled. Therefore, the data signal Vdata provided by the data line Data charges the first capacitor C1 via the photosensing transistor N1. When light irradiates the photosensing transistor N1, the intensity of an optical signal sensed by the photosensing transistor N1 increases. The photosensing transistor N1 converts the sensed optical signal into an electric signal, and thus the charging current for the first capacitor C1 is increased. For the photosensing transistor N1 normally receiving light irradiation, the electric signal stored by the first capacitor C1 has a fixed value.

The fourth transistor T4 is disabled because the first control signal VEm1 is at the high level. Therefore, the voltage of the first node a is not affected by the second voltage from the second voltage terminal Vint. By means of the holding function of the second capacitor C2, the first node a is maintained at the low level as a previous phase. Therefore, both the first drive transistor M1 and the second drive transistor M2 continues being enabled. The fifth transistor T5 is enabled because the scanning signal VScan1 is at the low level. Therefore, the data signal Vdata provided by the data line charges the second capacitor C2 via the fifth transistor T5 and the first drive transistor M1 until the voltage of the first node a reaches Vdata+Vth1. The first drive transistor M1 is disabled because the voltage of the first node a reaches Vdata+Vth1. Vth1 represents the threshold voltage of the first drive transistor M1. The sixth transistor T6 is disabled because the second control signal VEm2 is at the low level.

Figure 6:
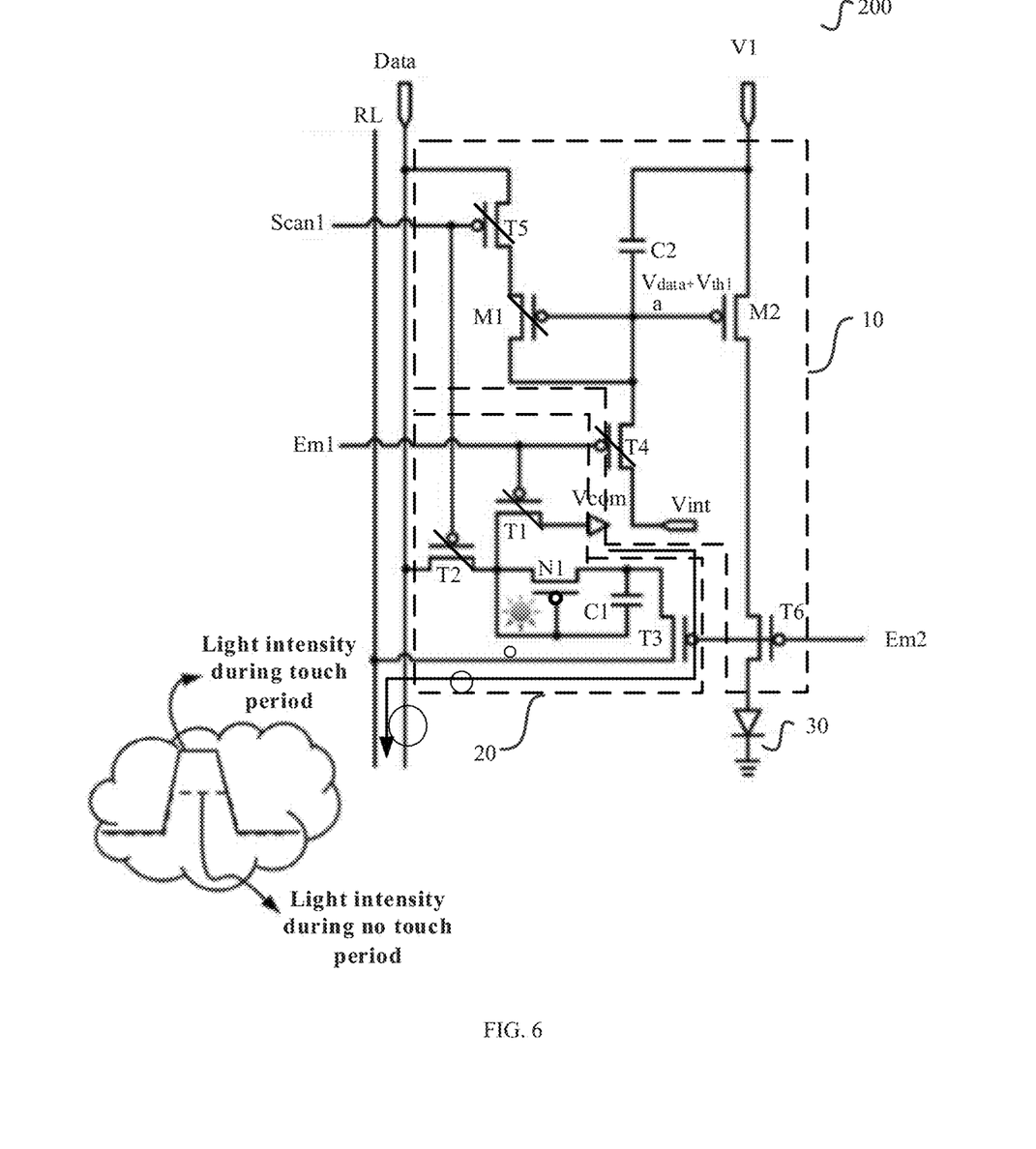
FIG. 6 is an exemplary equivalent circuit diagram of the pixel circuit according to an embodiment of the present disclosure in a third phase.

In the third phase III, The second control signal VEm2 and the data signal Vdata are at the low levels. The first control signal VEm1 and the scanning signal VScan1 are at the high level. FIG. 6 illustrates an exemplary equivalent circuit diagram of the pixel circuit 200 according to an embodiment of the present disclosure in the third phase III, wherein the oblique line on a transistor represents that this transistor is disabled.

The first transistor T1 is disabled because the first control signal VEm1 is at the high level. Therefore, the reset signal from the reset signal provision terminal does not have negative effect on the photosensing transistor N1 and the first capacitor C1. The second transistor T2 is disabled because the scanning signal VScan1 is at the high level. Therefore, the data signal Vdata cannot continue charging the first capacitor C1 via the second transistor T2. The third transistor T3 is enabled because the second control signal VEm2 is at the low level. Therefore, the first capacitor C1 discharges via the third transistor T3 to output the electric signal stored therein via the reading line RL.

The fourth transistor T4 is disabled because the first control signal VEm1 is at the high level. Therefore, the voltage of the first node a is not affected by the second voltage from the second voltage terminal Vint. The fifth transistor T5 is disabled because the scanning signal VScan1 is at the high level. Therefore, the voltage of the first node a is not affected by the data signal Vdata from the data signal terminal Data. The sixth transistor T6 is enabled because the second control signal VEm2 is at the low level. Therefore, the second drive transistor M2 generates a drive current and provides the drive current to the light-emitting element 30 (such as an OLED) via the sixth transistor T6.

Based on a saturation current formula of the drive transistor, the electric current IOLED flowing through the OLED may be as below:

$$I_{OLED} = K(V_{GS} - Vth2)^2 = K[(Vdata + Vth1) - V1 - Vth2]^2 = K(Vdata - V1)^2 \quad (1)$$

where $V_{GS}$ represents a gate-source voltage difference of the second drive transistor M2, i.e., a difference between the voltage of the first node a and the first voltage V1 provided by the first voltage terminal V1. Vth1 represents the threshold voltage of the first drive transistor M1. Vth2 represents the threshold voltage of the second drive transistor M2. It is believed that Vth1 is approximately equal to Vth2 (i.e., Vth1=Vth2) based on a mirror circuit principle.

As can be seen from Formula (1), the electric current IOLED flowing through the OLED at this phase is not affected by the threshold voltages Vth1 and Vth2, which avoids threshold voltage drift of the drive transistor caused by manufacturing process and long-time operation, eliminates the negative effect of the threshold voltages on the IOLED, and thus ensures proper functioning of the OLED. Thus, the service life of the OLED is prolonged, and uniformity of screen display is ensured.

Those skilled in the art should understand that in an alternative embodiment of this embodiment, all the transistors in the shift register unit 100 as shown in FIG. 2 and FIGS. 4-6 also may be N-type transistors. In this case, the first voltage terminal V1 outputs low level voltage, the second voltage terminal Vint outputs high level voltage, and the reset signal provision terminal outputs high level voltage. In this alternative embodiment, the voltage (not shown) of each signal in each phase is opposite to that of the corresponding signal in the corresponding phase as shown in FIG. 3.

Moreover, those skilled in the art also should understand that in other alternative embodiments of this embodiment, not merely a single type of transistors may be used. That is, some of the transistors may be N-type transistors, and the other transistors may be P-type transistors. Any variation and modification based on the embodiments of the present disclosure should fall within the scope of protection of the present disclosure.

Figure 7:
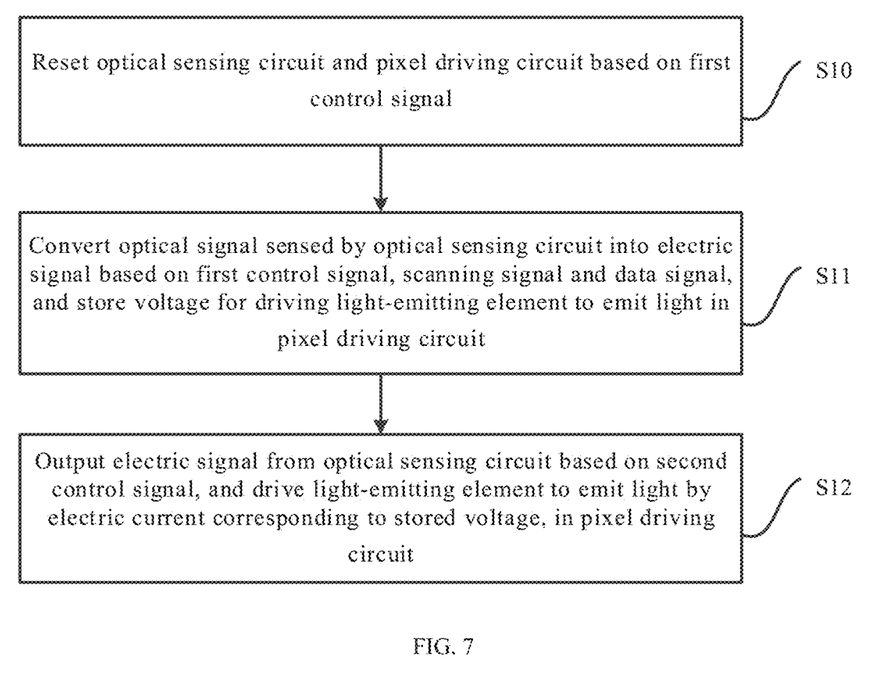
FIG. 7 is a schematic flowchart of a drive method for driving the pixel circuit as shown in FIG. 1 according to an embodiment of the present disclosure.

FIG. 7 illustrates a schematic flowchart of a drive method for driving the pixel circuit 100 as shown in FIG. 1 according to an embodiment of the present disclosure.

As shown in FIG. 7, in this drive method, in step S10, the optical sensing circuit 20 and the pixel driving circuit 10 are reset based on the first control signal Em1.

In one example, when the pixel circuit 200 as shown in FIG. 2 is driven, the reset signal is provided, based on the first control signal Em1, to the sensing reset unit 202 and the photoelectric sensor 201 to reset the first capacitor C1 and the photoelectric sensor 201. A second voltage is provided, based on the first control signal Em1, to the display reset unit 101 to reset the second capacitor C2.

In step S11, the optical signal sensed by the optical sensing circuit 20 is converted into the electric signal based on the first control signal Em1, the scanning signal Vscan and the data signal Vdata, and a voltage for driving the light-emitting element 30 to emit light is stored in the pixel driving circuit 10.

In one example, when the pixel circuit 200 as shown in FIG. 2 is driven, the data signal Vdata is provided, based on the first control signal Em1 and the scanning signal Vscan, to the sensing writing unit 203 and the photoelectric sensor 201, so as to provide the data signal Vdata to the first capacitor C1. The data signal Vdata is provided, based on the scanning signal Vscan, to the display writing unit 102 and the first drive transistor M1, such that the second capacitor C2 is charged until the first drive transistor M1 is disabled.

In step S12, the electric signal is outputted from the optical sensing circuit 20 based on the second control signal Em2, and the light-emitting element 30 is driven to emit light by an electric current corresponding to the stored voltage, in the pixel driving circuit 10.

In one example, when the pixel circuit 200 as shown in FIG. 2 is driven, the first capacitor C1 is discharged based on the second control signal Em2 via the sensing control unit 204 to output the electric signal through the reading line RL. The second drive transistor M2 is driven, based on the second control signal Em2 and the second capacitor C2, to generate a drive current, and the drive current is provided to the light-emitting element 30 via the display control unit 103.

Figure 8:
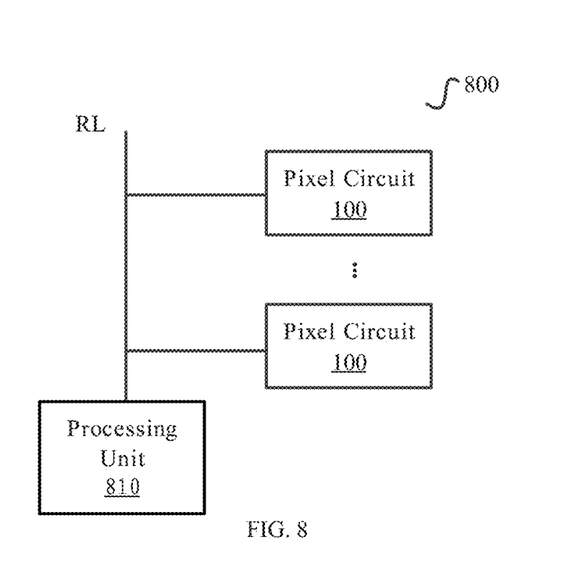
FIG. 8 is a schematic block diagram of a touch display apparatus according to an embodiment of the present disclosure.

FIG. 8 is a schematic block diagram of a touch display apparatus 800 according to an embodiment of the present disclosure. The touch display apparatus includes a plurality of pixel circuits 100 as shown in FIG. 1 and a processing unit 810.

In an example of the present disclosure, a light-emitting unit (not shown) may be arranged for the photoelectric sensor 201. The light-emitting unit may emit light at a preset frequency. During a touch operation, the light emitted by the light-emitting unit may be reflected to the photoelectric sensor 201. The photoelectric sensor 201 generates an electric signal based on the sensed reflected light.

The processing unit 810 is coupled to reading lines RLs of the plurality of pixel circuits 100, and is configured to determine whether the touch operation occurs based on electric signals from the plurality of reading lines RL.

For example, the optical sensing circuit 20 senses the light via the photoelectric sensor 201. When a finger or a laser pointer gets close to the pixel circuit, the optical signal sensed by the photoelectric sensor 201 is changed, which causes the outputted electric signal to be changed. Thus, the processing unit 810 may determine whether the touch operation occurs based on a preset threshold and a difference between the electric signal generated before the touch operation and the electric signal generated after the touch operation.

In one example, the processing unit 810 may be configured to calculate a variation of the optical signal based on the electric signals, and to determine whether the touch operation occurs based on the variation of the optical signal and the preset threshold. For example, the processing unit may include an amplifier and a processor. The electric signal may be transmitted to the amplifier via the reading line RL. The amplifier amplifies the electric signal and transmits the amplified signal to the processor. The processor makes a data analysis of the amplified signal to determine whether the variation of the optical signal exceeds the preset threshold so as to determine whether the touch operation occurs. Specifically, the processor may determine the variation of the optical signal based on the change of the electric signal before and after the touch operation, compare the variation of the optical signal with the preset threshold, and determine whether the touch operation (the variation of the optical signal) occurs based on the comparison result. For example, it is determined that the touch operation occurs if the variation of the optical signal exceeds the preset threshold.

It is to be understood that a plurality of pixel circuits 100 having optical sensing functions correspond to a plurality of sub-pixels, each pixel circuit 100 having the optical sensing function is configured to drive the light-emitting element 30 of the corresponding sub-pixel to emit light, and recognize the touch operation of the corresponding sub-pixel. The processing unit 810 is further configured to determine, when the touch operation occurs, a touch location based on the reading line RL and a second control line Em2 of the corresponding pixel circuit 100. In some embodiments of the present disclosure, an X-direction coordinate of the touch location is determined by the second control line Em2, and a Y-direction coordinate of the touch location is determined by the reading line RL. For example, it is determined that the touch operation occurs at a location (a, b) if the variation of the optical signal sensed by the photoelectric sensor 201 corresponding to the $a^{th}$ second control line Em2 and the $b^{th}$ reading line RL exceeds the preset threshold. Thus, the coordinates of the touch location may be determined based on the reading line RL and the second control line Em2.

It is to be noted that a display apparatus using an OLED does not need a liquid crystal to serve as a medium for grayscale display. Therefore, photosensing touch has no negative effect on display.

Figure 9:
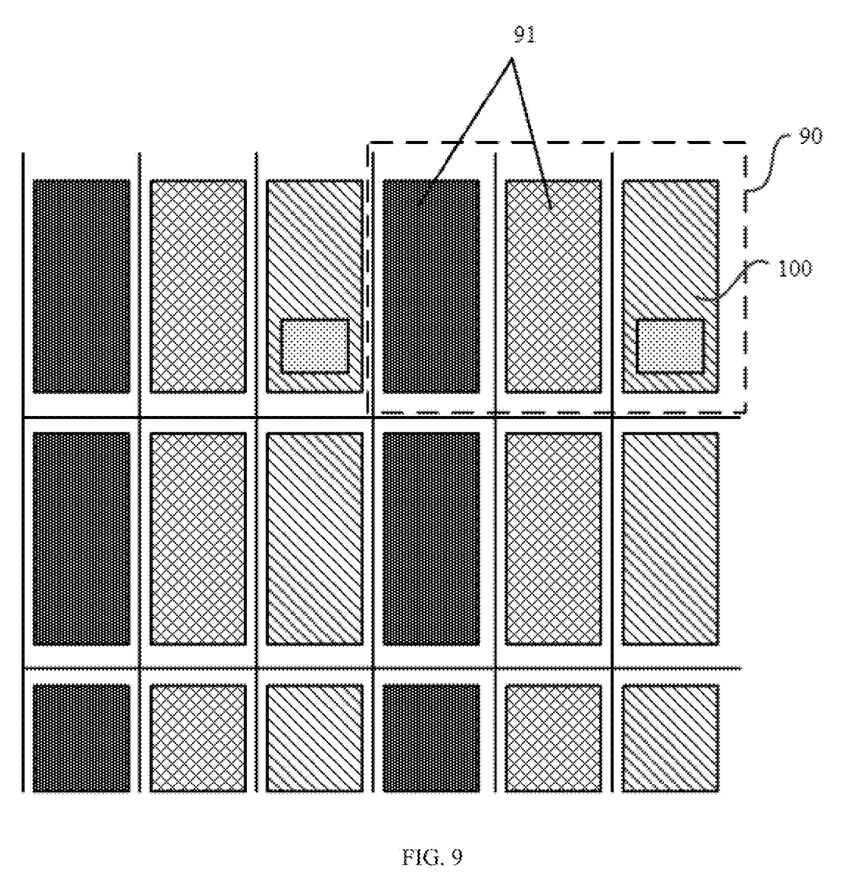
FIG. 9 is a schematic diagram of arrangement of a pixel circuit in the touch display apparatus according to an embodiment of the present disclosure.

FIG. 9 illustrates a schematic diagram of arrangement of a pixel circuit 100 in the touch display apparatus 800 according to an embodiment of the present disclosure. According to some embodiments of the present disclosure, the pixel circuits 100 are arranged as sub-pixels spaced apart from one another. In the embodiment as shown in FIG. 9, every three sub-pixels form a group to constitute a pixel unit 90. Each pixel unit 90 may include two traditional pixel circuits 91 and one pixel circuit 100 according to some embodiments of the present disclosure. The traditional pixel circuit 91 only can implement the display function but does not have the optical sensing function. The pixel circuit 100 according to the embodiments of the present disclosure can implement integration of the optical sensing function and the display function.

The pixel circuits according to some embodiments of the present disclosure may be arranged as sub-pixels spaced apart from one another with other resolutions, which is not limited by the embodiments of the present disclosure.

In one example, the touch display apparatus may be an AMOLED touch display.

The touch display apparatus provided by some embodiments of the present disclosure can implement efficient integration of a display function and an optical sensing function, which can enhance added value of products.

The touch display apparatus according to some embodiments of the present disclosure may be applied to any product having a display function, such as an electronic paper display, a mobile phone, a tablet computer, a TV set, a notebook computer, a digital photo frame, or a navigation device and so on.

In addition, terms "first" and "second" are used only for purposes of description and are not intended to indicate or imply relative importance or to imply the number of indicated technical features. Thus, the feature defined with "first" and "second" may explicitly or implicitly include at least one such feature. As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted inclusively rather than exclusively. Likewise, the terms "include" and "or" should all be construed to be inclusive, unless such an interpretation is clearly prohibited from the context. Where used herein the term "examples," particularly when followed by a listing of terms is merely exemplary and illustrative, and should not be deemed to be exclusive or comprehensive.

In the present disclosure, unless specified or limited otherwise, terms such as "install", "couple", "connect" or "fix" should be understood in a broad sense, which may be, for example, a fixed coupling, a detachable coupling or integrated coupling, a mechanical coupling or an electrical coupling, a direct coupling or indirect coupling via an intermediary, an internal communication between two components or an interaction relationship between two components. For those of ordinary skill in the art, specific meanings of the above terms in the present disclosure may be understood based on specific circumstances.

In the present disclosure, unless specified or limited otherwise, a first feature "on" or "below" a second feature may include an embodiment in which the first feature is in direct contact with the second feature, and may also include an embodiment in which the first feature and the second feature are in indirect contact via an intermediary. Furthermore, a first feature "on," "above," or "on top of" a second feature may include an embodiment in which the first feature is right or obliquely "on," "above," or "on top of" the second feature, and may also include an embodiment in which the first feature is at a height higher than that of the second feature. A first feature "below," "under," or "on bottom of" a second feature may include an embodiment in which the first feature is right or obliquely "below," "under," or "on bottom of" the second feature, and may also include an embodiment in which the first feature is at a height lower than that of the second feature.

Reference throughout this specification to the terms "an embodiment," "some embodiments," "an example," "a specific example," or "some examples," means that a specific feature, structure, material, or characteristic described in connection with the embodiment or example is included in at least one embodiment or example of the present disclosure. The schematic representation of the above terms throughout this specification is not necessarily referring to the same embodiment or example. Furthermore, the specific features, structures, materials, or characteristics may be combined in any suitable manner in one or more embodiments or examples. In addition, if there is no contradiction, those skilled in the art may combine different embodiments or examples described in the specification with features of different embodiments or examples.

The description of any process or method in the flowcharts or in other manners herein may be understood as being indicative of one or more modules, segments or parts including codes of executable instructions for realizing the steps of customized logic functions or processes, and the scope of the example embodiments of the present disclosure includes other implementations, where the functions may be executed in sequences different from those shown or discussed, including executing the functions according to the related functions in a substantially simultaneous manner or in a reverse sequence, which should be understood by those skilled in the art to which the embodiments of the present disclosure pertain.

The logic and/or steps shown in the flowcharts or described in other manners here may be, for example, understood as a sequencing list of executable instructions for implementing logic functions, which may be embodied in any computer readable medium, for use by an instruction executing system, apparatus or device (such as a system based on a computer, a system including a processor, or other systems capable of fetching instructions from the instruction executing system, apparatus or device and executing the instructions), or for use in combination with the instruction executing system, apparatus or device. As to the context, "the computer readable medium" may be any apparatus adaptive for including, storing, communicating, propagating, or transferring programs to be used by or in combination with the instruction executing system, apparatus, or device. More specific examples (a non-exhaustive list) of the computer readable medium include but are not limited to an electronic connection (an electronic device) with one or more wires, a portable computer enclosure (a magnetic device), a random access memory (RAM), a read only memory (ROM), an erasable programmable read-only memory (EPROM or a flash memory), an optical fiber device, and a portable compact disk read-only memory (CDROM). In addition, the computer readable medium may even be a paper or other appropriate medium capable of printing programs thereon, this is because, for example, the paper or other appropriate medium may be optically scanned and then edited, decrypted, or processed in other appropriate ways when necessary to obtain the programs in an electric manner, and then the programs may be stored in the memories of the computer.

It is to be understood that each part of the present disclosure may be realized by the hardware, software, firmware, or their combination. In the above embodiments, a plurality of steps or methods may be realized by the software or firmware stored in the memory and executed by the appropriate instruction executing system. For example, if it is implemented by the hardware, likewise in another embodiment, the steps or methods may be implemented by one or a combination of the following techniques known in the art: a discrete logic circuit having a logic gate circuit for implementing a logic function of a data signal, an application-specific integrated circuit having an appropriate combination logic gate circuit, a programmable gate array (PGA), a field programmable gate array (FPGA), etc.

Those of ordinary skill in the art shall understand that all or parts of the steps for implementing the method of the above embodiments may be achieved by commanding the related hardware though programs. The programs may be stored in a computer readable storage medium, and when the programs are executed, the programs include one or a combination of the steps in the method embodiments.

In addition, various functional units in various embodiments of the present disclosure may be integrated into one processing module, or various units may be separately or physically existent, or two or more units may be integrated into one module. The above integrated module may be implemented in the form of hardware or in the form of software function modules. When the integrated module is implemented in the form of software function modules and is sold or used as a standalone product, the integrated module may be stored in a computer readable storage medium.

The aforementioned storage medium may be a read-only memory, a magnetic disk or optical disk, etc. Although some embodiments of the present disclosure have been shown and described above, it would be appreciated by those of ordinary skill in the art that the above embodiments are exemplary and shall not be construed as limiting the present disclosure, and any changes, modifications, replacements, and variations may be made to the above embodiments without departing from the scope of the present disclosure.

What is claimed is:

1. A pixel circuit comprising a pixel driving circuit, an optical sensing circuit, and a light-emitting element;
   wherein the pixel driving circuit is configured to drive the light-emitting element to emit light, based on a first control signal from a first control line, a second control signal from a second control line, a scanning signal from a scanning line, and a data signal from a data line;
   wherein the optical sensing circuit is configured to sense an optical signal, convert the sensed optical signal into an electric signal, and output the electric signal via a reading line based on the first control signal, the second control signal, the scanning signal, and the data signal;
   wherein the optical sensing circuit comprises a photosensing transistor, a first capacitor, a first transistor, a second transistor, and a third transistor;
   wherein a control electrode of the photosensing transistor is coupled to a first terminal of the first capacitor and a first electrode of the photosensing transistor, and a second electrode of the photosensing transistor is coupled to a second terminal of the first capacitor;
   wherein a control electrode of the first transistor is coupled to the first control line, a first electrode of the first transistor is coupled to a reset signal provision terminal providing a reset signal, and a second electrode of the first transistor is coupled to the first electrode and the control electrode of the photosensing transistor;
   wherein a control electrode of the second transistor is coupled to the scanning line, a first electrode of the second transistor is coupled to the data line, and a second electrode of the second transistor is coupled to the first electrode and the control electrode of the photosensing transistor;
   wherein a control electrode of the third transistor is coupled to the second control line, a first electrode of the third transistor is coupled to the second terminal of the first capacitor, and a second electrode of the third transistor is coupled to the reading line;
   wherein the pixel driving circuit comprises a first drive transistor, a second drive transistor, a second capacitor, a fourth transistor, a fifth transistor, and a sixth transistor;
   wherein a control electrode and a second electrode of the first drive transistor are coupled to a control electrode of the second drive transistor via a first node, and a first electrode of the first drive transistor is coupled to a second electrode of the fifth transistor;
   wherein a first electrode of the second drive transistor is coupled to a first voltage terminal providing a first voltage, and a second electrode of the second drive transistor is coupled to a first electrode of the sixth transistor;
   wherein a first terminal of the second capacitor is coupled to the first node, and a second terminal of the second capacitor is coupled to the first voltage terminal;
   wherein a control electrode of the fourth transistor is coupled to the first control line, a first electrode of the fourth transistor is coupled to a second voltage terminal providing a second voltage, and a second electrode of the fourth transistor is coupled to the first node;
   wherein a control electrode of the fifth transistor is coupled to the scanning line, and a first electrode of the fifth transistor is coupled to the data line;
   wherein a control electrode of the sixth transistor is coupled to the second control line, and a second electrode of the sixth transistor is coupled to the light-emitting element;
   wherein a duration of the first control signal when it validates the first transistor and the fourth transistor is same as a duration of the scanning signal when it validates the second transistor and the fifth transistor; and
   wherein a duration of the data signal being valid partially overlaps with the duration of the first control signal.

2. A touch display apparatus comprising a plurality of pixel circuits according to claim 1; and
   a processing unit coupled to reading lines of the plurality of pixel circuits and configured to determine whether a touch operation occurs based on electric signals from the plurality of reading lines.

3. The touch display apparatus according to claim 2, wherein the processing unit is configured to calculate a variation of the optical signal based on the electric signals, and to determine whether the touch operation occurs based on the variation of the optical signal and a preset threshold.

4. The touch display apparatus according to claim 3, wherein the processing unit is further configured to determine, when the touch operation occurs, a touch location based on the reading line of the corresponding pixel circuit and the second control line.

5. The touch display apparatus according to claim 2, wherein the plurality of pixel circuits are arranged as sub-pixels spaced apart from one another.

6. A drive method for driving the pixel circuit according to claim 1, the method comprising:
   resetting the optical sensing circuit and the pixel driving circuit based on the first control signal;
   converting the optical signal sensed by the optical sensing circuit into the electric signal based on the first control signal, the scanning signal, and the data signal, and storing a voltage for driving the light-emitting element to emit light in the pixel driving circuit; and
   outputting the electric signal from the optical sensing circuit based on the second control signal, and driving the light-emitting element to emit light by an electric current corresponding to the stored voltage, in the pixel driving circuit.

7. The drive method according to claim 6, wherein the drive method further comprises:
   providing, based on the first control signal, a second voltage to the display reset unit to reset the second capacitor;
   providing, based on the scanning signal, the data signal to the display writing unit and the first drive transistor, such that the second capacitor is charged until the first drive transistor is disabled; and
   driving the second drive transistor to generate a drive current based on the second control signal and the second capacitor, and providing the drive current to the light-emitting element via the display control unit.

* * * * *